US005544185A

United States Patent [19]
Kadoiwa et al.

[11] Patent Number: 5,544,185
[45] Date of Patent: Aug. 6, 1996

[54] VISIBLE LIGHT LASER DIODE AND MANUFACTURING METHOD OF VISIBLE LIGHT LASER DIODE

[75] Inventors: Kaoru Kadoiwa; Manabu Kato, both of Itami, Japan

[73] Assignee: Mitsubishi Denki Kabushiki Kaisha, Tokyo, Japan

[21] Appl. No.: 355,349

[22] Filed: Dec. 12, 1994

[30] Foreign Application Priority Data

Dec. 13, 1993 [JP] Japan ................................. 5-310947

[51] Int. Cl.⁶ .................................................. H01S 3/19
[52] U.S. Cl. ................................................ 372/44; 372/45
[58] Field of Search ........................................ 372/43–50

[56] References Cited

U.S. PATENT DOCUMENTS 4,504,952  3/1985  Hartman et al. ........................ 372/45
5,255,279  10/1993  Takahashi et al. ..................... 372/46
5,381,024  1/1995  Valster ............................... 372/45 X Primary Examiner—John D. Lee
Attorney, Agent, or Firm—Leydig, Voit & Mayer

[57] ABSTRACT

A visible light laser diode includes an etching stopping layer having a lower etching rate in an etching solution than a cladding layer, having a larger band gap energy in bulk than the band gap energy of the active layer, including a layer that stops etching, and having a band gap energy exceeding an energy corresponding to the oscillation wavelength of the visible light laser diode. Therefore, the cladding layer can be selectively etched with satisfactory controllability to a predetermined shape. After the etching process, even with a laminated etching stopping layer partly remaining in the cladding layer, the etching stopping layer does not absorb light emitted from the active layer.

19 Claims, 12 Drawing Sheets

SEE Fig.3(a)

■ unstrained $Ga_{0.5}In_{0.5}P$ (10c1)
● tensile strained(=0.5%) $Ga_{0.57}In_{0.43}P$ (10c2)

VISIBLE LIGHT LASER DIODE AND MANUFACTURING METHOD OF VISIBLE LIGHT LASER DIODE

FIELD OF THE INVENTION

The present invention relates to a visible light laser diode and a manufacturing method thereof and having an etching stopper layer in the vicinity of an active layer.

BACKGROUND OF THE INVENTION

FIG. 11 is a sectional view illustrating a prior art visible light laser diode. This visible light laser diode has an oscillation wavelength of 633 nm. In the figure, reference numeral 1 designates an n-type GaAs substrate. Using an MOCVD apparatus, an n-type $(Al_{0.7}Ga_{0.3})_{0.5}In_{0.5}P$ cladding layer 2 having a thickness of 1.5 μm, an undoped $Ga_{0.5}In_{0.5}P$ active layer 6 having a multiple quantum well structure, a first p-type $(Al_{0.7}Ga_{0.3})_{0.5}In_{0.5}P$ cladding layer 3a having a thickness of 0.25 μm, a $Ga_{0.5}In_{0.5}P$ etching stopper layer 9 having a thickness of 5 nm, and a second p-type $(Al_{0.7}Ga_{0.3})_{0.5}In_{0.5}P$ cladding layer 3b having a thickness of 1.25 μm are successively formed on the n-type GaAs substrate 1. After the second p-type $(Al_{0.7}Ga_{0.3})_{0.5}In_{0.5}P$ cladding layer 3b is formed into a mesa shape by selective etching, using again the MOCVD apparatus, an n-type GaAs current blocking layer 4 is formed on a portion where the second p-type $(Al_{0.7}Ga_{0.3})_{0.5}In_{0.5}P$ cladding layer 3b is etched and removed. Further, a p-type GaAs cap layer 5 is formed on the mesa shaped second p-type $(Al_{0.7}Ga_{0.3})_{0.5}In_{0.5}P$ cladding layer 3b and the n-type GaAs current blocking layer 4 to form a layer structure, and an n-type and p-type electrode 13 and 14 are formed on the lowermost and uppermost surfaces, respectively, of this layer structure.

A function of an etching stopper layer and a production method of a mesa shaped cladding layer will be described.

At first, in order for lateral mode control of the visible light laser diode, it is required to keep the first p-type $(Al_{0.7}Ga_{0.3})_{0.5}In_{0.5}P$ cladding layer 3a to a predetermined thickness, (in the case of illustrated prior art visible light laser diode structure, 0.25 μm) and to form the second p-type $(Al_{0.7}Ga_{0.3})_{0.5}In_{0.5}P$ cladding layer 3b in a mesa shape. In this example, however, because the same material, $(Al_{0.7}Ga_{0.3})_{0.5}In_{0.5}P$, is used for both the first and second cladding layers, there is no difference in the etching rates of the layers. Therefore, it is impossible to form the two cladding layers into the above-described shape by forming the second p-type $(Al_{0.7}Ga_{0.3})_{0.5}In_{0.5}P$ cladding layer 3b directly on the first p-type $(Al_{0.7}Ga_{0.3})_{0.5}In_{0.5}P$ cladding layer 3a.

Accordingly, an etching stopper layer having a predetermined thickness, comprising a material having an etching rate sufficiently lower than that of $(Al_{0.7}Ga_{0.3})_{0.5}In_{0.5}P$ to the etchant used for forming the mesa shape of $(Al_{0.7}Ga_{0.3})_{0.5}In_{0.5}P$, is introduced between the first and second p-type $(Al_{0.7}Ga_{0.3})_{0.5}In_{0.5}P$ cladding layers, whereby it is possible to form these layers into a cladding layer of the mesa shape having a skirt of a predetermined thickness. As shown in FIG. 12(a), when a sulfuric acid series etching solution is used, the above-described etching stopper layer 9, employing $Ga_{0.5}In_{0.5}P$ having an etching rate which is around one-fiftieth of the etching rate of $(Al_{0.7}Ga_{0.3})_{0.5}In_{0.5}P$ and having a thickness of 5 nm, is formed between the first and second p-type $(Al_{0.7}Ga_{0.3})_{0.5}In_{0.5}P$ cladding layers 3a and 3b.

When a SiN film 12 is used as a mask and the second p-type $(Al_{0.7}Ga_{0.3})_{0.5}In_{0.5}P$ cladding layer 3b is etched with the above-described sulfuric acid series etching solution as shown in FIG. 12(b), by the function of the $Ga_{0.5}In_{0.5}P$ etching stopper layer 9 having a sufficiently lower etching rate than the second p-type $(Al_{0.7}Ga_{0.3})_{0.5}In_{0.5}P$ cladding layer 3b, it is possible to stop the etching with satisfactory controllability just before reaching the first p-type $(Al_{0.7}Ga_{0.3})_{0.5}In_{0.5}P$ cladding layer 3a and to form a cladding layer comprising the first p-type $(Al_{0.7}Ga_{0.3})_{0.5}In_{0.5}P$ cladding layer 3a having a predetermined thickness and the second p-type $(Al_{0.7}Ga_{0.3})_{0.5}In_{0.5}P$ cladding layer 3b having a mesa shape on the undoped $Ga_{0.5}In_{0.5}P$ active layer 6.

Subsequently, as shown in FIG. 12(c), an n-type GaAs current blocking layer 4 is formed where the second p-type $(Al_{0.7}Ga_{0.3})_{0.5}In_{0.5}P$ cladding layer 3b is etched and removed to form the mesa shape. After removing the SiN film 12 which was used as a mask in the above-described process of etching the cladding layer, a p-type GaAs cap layer 5 is formed on the exposed top surfaces of the mesa shaped second p-type $(Al_{0.7}Ga_{0.3})_{0.5}In_{0.5}P$ cladding layer 3b and the n-type GaAs current blocking layer 4, whereby a predetermined layer structure is formed.

Further, p-type and n-type electrodes 14 and 13 are formed on the upper surface of the p-type GaAs cap layer 5 and the lower surface of the n-type GaAs substrate 1, respectively, whereby a visible light laser diode as shown in FIG. 11 is obtained.

The visible light laser diode which is manufactured by the above-described method including the process of forming the mesa shaped cladding layer, is driven by applying a required driving current between the n-type and p-type electrodes 13 and 14 to emit a laser beam with a wavelength of 633 nm.

In the prior art visible light laser diode, GaAs is frequently used for the substrate, and generally an etching stopper layer is formed comprising $Ga_{0.5}In_{0.5}P$, lattice matching with the GaAs substrate to form a cladding layer on an active layer into a predetermined shape. Other than the above-described layer structure, Japanese Published Patent Application No. Sho 3-112186 discloses a visible light laser diode in which a buffer layer of $Ga_{0.5}In_{0.5}P$ having a thickness of 40 Å is introduced between two cladding layers of AlGaInP and AlGaAs in order to improve the voltage-current characteristic and to enhance the controllability of etching.

Japanese Published Patent Application No. Hei 3-73584 discloses a semiconductor laser device having an oscillation wavelength of below 660 nm, which is manufactured by a method including a process of successively forming a $Ga_{0.5}In_{0.5}P$ etching stopper layer (with a thickness of 0.05 μm) and a GaAs current blocking layer (with a thickness of 0.6 μm) on a $(Al_{0.6}Ga_{0.4})_{0.5}In_{0.5}P$ cladding layer and a process of selectively etching a portion of the GaAs current blocking layer.

The prior art visible light laser diode and the manufacturing method thereof are as described above. In order to form the first and second p-type $(Al_{0.7}Ga_{0.3})_{0.5}In_{0.5}P$ cladding layers 3a and 3b on the undoped $Ga_{0.5}In_{0.5}P$ active layer 6 into a predetermined shape, it is unavoidably required to introduce the $Ga_{0.5}In_{0.5}P$ etching stopper layer 9 between the two cladding layers 3a and 3b. In addition, it is not possible to remove the $Ga_{0.5}In_{0.5}P$ etching stopper layer 9 after forming the first and second p-type $(Al_{0.7}Ga_{0.3})_{0.5}In_{0.5}P$ cladding layers 3a and 3b into predetermined shapes, and a layer structure in which the $Ga_{0.5}In_{0.5}P$ etching stopper layer 9 partly remains above the undoped $Ga_{0.5}In_{0.5}P$ active layer 6 results, as shown in FIG. 11. Since the $Ga_{0.5}In_{0.5}P$ etching stopper layer 9 has a thickness of 5 nm, a quantum well is formed between the first and second p-type $(Al_{0.7}Ga_{0.3})_{0.5}In_{0.5}P$ cladding layers 3a and 3b, and the energy level of this quantum well is in the vicinity of 640 nm in wavelength. During forming $(Al_{0.7}Ga_{0.3})_{0.5}In_{0.5}P$ barrier layers 3d and 3e and a $Ga_{0.5}In_{0.5}P$ well layer 9b and varying the well width of the $Ga_{0.5}In_{0.5}P$ well layer 9b, the wavelength of photoluminescent (PL) light as measured at 4.2° K is converted into a band gap energy and plotted by white circles as shown in FIG. 13(a), while solid line 1 shown in FIG. 13(b) shows the energy band gap as a theoretical value obtained from calculation of wave functions, and these represent the above-described results.

Since the above-described $Ga_{0.5}In_{0.5}P$ etching stopper layer 9 having a thickness of 5 nm serves as a kind of absorption layer to light of an oscillation wavelength of 633 nm which is emitted from the undoped $Ga_{0.5}In_{0.5}P$ active layer 6, it is a light sink and the current characteristic is deteriorated at high output, degrading the performance of the visible light laser diode. When the oscillation wavelength of the visible light laser diode is in the 670 nm band, the layer structure with the remaining $Ga_{0.5}In_{0.5}P$ etching stopper layer 9 absorbs no light and causes no problem. However, recent development of the crystal growth technique enables utilization of the quantum effect which occurs due to reducing the active layer well width, thereby to shorten the oscillation wavelength in a visible laser diode. For example, a visible light laser diode replacing a HeNe Gas laser having a wavelength of 633 nm, having an active layer of a well width below 4 nm has been described in various papers presented before Societies, for instance, Japanese Journal of Applied Physics, Autumn of 1992. The shortening of the oscillation wavelength of such visible light laser diodes is required for application to optical disks, bar code readers, laser beam printers, or the like, as a trend of the times. This enables improvement in the speed of data writing into an optical disk, reduction in the required power, or the like. This further eases data recorded in a high vision system, further advancing the shortening of wavelength, hereby making the above-described problems unavoidable ones.

Japanese Journal of Applied Physics, Vol. 29, No. 9, September, 1990, 11.L1669-L1671, discloses a 632.7 nm visible light laser diode, which comprises a p-type $(Al_{0.19}Ga_{0.81})_{0.5}In_{0.5}P$ etching stopper layer (with a thickness of 5 nm) disposed on a p-type $(Al_{0.6}Ga_{0.4})_{0.5}In_{0.5}P$ inner cladding layer (with a thickness of 0.25 μm) disposed on an undoped $(Al_{0.19}Ga_{0.81})_{0.5}In_{0.5}P$ active layer, and a p-type $(Al_{0.7}Ga_{0.3})_{0.5}In_{0.5}P$ outer cladding layer (with a thickness of 0.7 μm) formed into a mesa-shape. Though this layer structure is free from light absorption by the etching stopper layer, when the p-type $(Al_{0.7}Ga_{0.3})_{0.5}In_{0.5}P$ outer cladding layer is formed into the mesa shape, the p-type $(Al_{0.19}Ga_{0.81})_{0.5}In_{0.5}P$ etching stopper layer including 19% of Al has a small etching selectivity ratio relative to the p-type $(Al_{0.7}Ga_{0.3})_{0.5}In_{0.5}P$ outer cladding layer, and it was impossible to stop the etching sufficiently.

SUMMARY OF THE INVENTION

It is an object to provide a visible light laser diode including an etching stopper layer having a high etching controllability and free from light absorption from an active layer, having a low laser oscillation threshold, and having an improved current characteristic at high output oscillation.

It is another object of the present invention to provide a manufacturing method thereof.

Other objects and advantages of the present invention will become apparent from the detailed description given hereinafter; it should be understood, however, that the detailed description and specific embodiment are given by way of illustration only, since various changes and modifications within the scope of the invention will become apparent to those skilled in the art from this detailed description.

According to a first aspect of the present invention, a visible light laser diode includes an etching stopper layer comprising a material having a sufficiently low etching rate in a predetermined etching solution compared to the etching rate of the material forming the cladding layer and having a larger band gap energy in bulk than the band gap energy of the active layer, and including a layer having such a thickness that stops the etching at the surface of the etching stopper layer or at a predetermined position therein and having an energy quantum level exceeding a band gap energy corresponding to the oscillation wavelength of the visible light laser diode. Therefore, the cladding layer can be selectively etched with satisfactory controllability with the etching stopper layer to make a predetermined shape. After the etching process, even in a laminated structure having the etching stopper layer partly remaining in the cladding layer, it is possible to prevent the etching stopper layer from absorbing light emitted from the active layer.

According to a second aspect of the present invention, a visible light laser diode includes an etching stopper layer comprising a material having an etching rate which is below one-fiftieth of that of the cladding layer in the etching performed with sulfuric acid series etching solution.

According to a third aspect of the present invention, a visible light laser diode includes a plurality of semiconductor layers grown on a GaAs substrate, the active layer is a multiple quantum well structure employing GaInP, the cladding layer is a thin crystalline film comprising AlGaInP, and the etching stopper layer is a quantum well structure employing a GaInP thin crystalline film having a large Ga composition and a lattice constant smaller than that of the GaAs substrate. Therefore, the etching stopper layer has a high selectivity relative to the cladding layer, and a quantum well having a tensile stress producing a larger band gap energy than that of the active layer is formed in the cladding layer, whereby the cladding layer can be formed into a predetermined shape with good controllability, and it is possible to prevent the etching stopper layer from absorbing light emitted from the active layer.

According to a fourth aspect of the present invention, a visible light laser diode is a 633 nm band visible light laser diode including an active layer comprising $Ga_{0.5}In_{0.5}P$, the cladding layer is an AlGaInP thin crystalline layer having a band gap energy in bulk of 2.34 eV, and the etching stopper layer is a GaInP thin crystalline layer having a band gap energy in bulk of 2.00 eV and is provided at a predetermined position of the cladding layer to form a single quantum well having an approximately 5 nm width well.

According to a fifth aspect of the present invention, a visible light laser diode is a 633 nm band visible light laser diode including an active layer comprising $Ga_{0.5}In_{0.5}P$, the cladding layer is a thin crystalline layer comprising $(Al_{0.7}Ga_{0.3})_{0.5}In_{0.5}P$, and the etching stopper layer comprises a multiple quantum well structure of alternately laminated $Ga_xIn_{1-x}P$ ($0.53 \leq x \leq 0.57$) thin crystalline layers and $(Al_{0.7}Ga_{0.3})_{0.5}In_{0.5}P$ thin crystalline layers so that the sum of thicknesses of the $Ga_xIn_{1-x}P$ thin crystalline layers is about 5 nm.

According to a sixth aspect of the present invention, a visible light laser diode includes the etching stopper layer disposed at such a position that the stress of the lattice strain caused by the lattice mismatch between the etching stopper layer and the GaAs structure is applied to the active layer.

According to a seventh aspect of the present invention, a visible light laser diode is a 633 nm band visible light laser diode including an active layer comprising $Ga_{0.5}In_{0.5}P$, and the etching stopper layer has a multiple quantum well structure with alternately laminated $Ga_xIn_{1-x}P$ ($0.53 \leq x \leq 0.57$) thin crystalline layers and $(Al_yGa_{1-y})_{1-x}P$ ($0.7 \leq y \leq 0.53$, $0.53 \leq x \leq 0.57$) thin crystalline layers.

According to an eighth aspect of the present invention, a visible light laser diode includes an etching stopper layer comprising a laminated layer having a plurality of $Ga_xIn_{1-x}P$ thin crystalline layers with a total thickness exceeding 5 nm.

According to a ninth aspect of the present invention, a manufacturing method of a visible light laser diode includes employing a material having a sufficiently lower etching rate in a predetermined etching solution than the etching rate of the material forming the cladding layer and having a larger band gap energy in bulk than the band gap energy of the active layer, and forming an etching stopper layer at a predetermined position in the cladding layer that stops the etching at the surface of the etching stopper layer or at a predetermined position therein and having such a thickness that provides a quantum level energy exceeding the band gap corresponding to the oscillation wavelength of the visible light laser diode.

According to a tenth aspect of the present invention, a manufacturing method of a visible light laser diode includes forming an active layer of a multiple quantum well structure employing GaInP on a GaAs substrate, forming a first cladding layer on the active layer employing AlGaInP, forming an etching stopper layer having a single quantum well structure or a multiple quantum well structure employing GaInP having a larger Ga composition and a smaller lattice constant than the GaAs substrate on the first cladding layer, forming a second cladding layer employing AlGaInP on the etching stopper layer, and partly etching and removing the second cladding layer to form the same in a predetermined shape.

According to an eleventh aspect of the present invention, a manufacturing method of a visible light laser diode includes a process step of partly etching and removing the second cladding layer to make the same a predetermined shape employing a sulfuric acid series etching solution having a ratio of the etching rates between the second cladding layer and the etching stopper layer that is equal to about 50:1.

According to a twelfth aspect of the present invention, in the manufacturing method of a visible light laser diode, the visible light laser diode is a 633 nm band visible light laser diode employing $Ga_{0.5}In_{0.5}P$ for the active layer, the first and second cladding layers comprise AlGaInP having a band gap energy in bulk of 2.34 eV, the etching stopper layer comprises GaInP having a band gap energy in bulk of 2.00 eV and having a thickness of about 5 nm, and the second AlGaInP cladding layer is partly etched and removed with a sulfuric acid series etching solution.

According to a thirteenth aspect of the present invention, in the manufacturing method of a visible light laser diode, the visible light laser diode is a 633 nm band visible light laser diode employing $Ga_{0.5}In_{0.5}P$ for the active layer, the first and second cladding layers comprise $(Al_{0.7}Ga_{0.3})_{0.5}In_{0.5}P$, the etching stopper layer has alternately laminated $Ga_xIn_{1-x}P$ ($0.53 \leq x \leq 0.57$) thin crystalline layers and $(Al_{0.7}Ga_{0.3})_{0.5}In_{0.5}P$ thin crystalline layers such that the sum of thicknesses of the $Ga_xIn_{1-x}P$ thin crystalline layers is about 5 nm, and the second $(Al_{0.7}Ga_{0.3})_{0.5}In_{0.5}P$ cladding layer is partly etched and removed with a sulfuric acid series etching solution.

According to a fourteenth aspect of the present invention, a manufacturing method of a visible light laser diode includes forming the first cladding layer having such a thickness that the stress due to the lattice strain that is generated by the lattice mismatching between the etching stopper layer and the GaAs substrate is applied to the active layer, and forming the etching stopper layer on the cladding layer. Therefore, the active layer is stressed in the compressive direction by the tensile strain in the etching stopper layer, whereby it is possible to broaden the band gap energy of the active layer and make the oscillation wavelength shorter.

According to a fifteenth aspect of the present invention, in the manufacturing method of a visible light laser diode, the visible light laser diode is a 633 nm band visible light laser diode employing $Ga_{0.5}In_{0.5}P$ for the active layer, the first and second cladding layers comprise $(Al_{0.7}Ga_{0.3})_{0.5}In_{0.5}P$, the etching stopper layer having a multiple quantum well structure comprises alternating laminations of thin crystalline layers of $Ga_xIn_{1-x}P$ ($0.53 \leq x \leq 0.57$) and thin crystalline layers of $(Al_yGa_{1-y})_{1-x}In_xP$ ($0.7 \leq y \leq 1$, $0.53 \leq x \leq 0.57$), and the second $(Al_{0.7}Ga_{0.3})_{0.5}In_{0.5}P$ cladding layer is partly etched and removed with a sulfuric acid series etching solution. Therefore, layers are laminated with a tensile stress applied to the $Ga_xIn_{1-x}P$ thin crystalline layers being cancelled by a stress in the compressive direction applied to the $(Al_yGa_{1-y})_{1-x}In_xP$ thin crystalline layers, whereby it is possible to increase the band gap energy by increasing the number of quantum wells in the etching stopper layer and to obtain high etching controllability with thick layers.

According to a sixteenth aspect of the present invention, in the manufacturing method of a visible light laser diode, the etching stopper layer includes a plurality of $Ga_xIn_{1-x}P$ thin crystalline layers having a total thickness exceeding 5 nm.

DETAILED DESCRIPTION OF THE PREFERRED EMBODIMENT

Embodiment 1

A first embodiment of the present invention will be described with reference to the drawings.

Figure 1A:
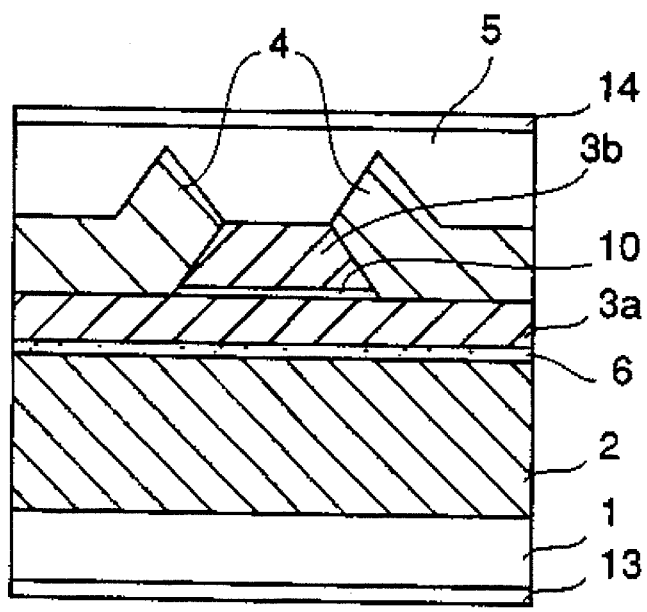
FIG. 1(a) is a sectional view illustrating a visible light laser diode in accordance with a first embodiment of the present invention.

FIG. 1(a) is a sectional view illustrating a 633 nm band visible light laser diode according to this first embodiment. In the figure, reference numeral 1 designates an n-type GaAs substrate. Using an MOCVD apparatus, an n-type $(Al_{0.7}Ga_{0.3})_{0.5}In_{0.5}P$ cladding layer 2 having a thickness of 1.5 μm, an undoped $Ga_{0.5}In_{0.5}P$ active layer 6 having a multiple quantum well structure having a quadrupled structure of well and barrier layers having thicknesses of 6 and 8 nm, respectively, and a guide layer having a thickness of 50 to 80 nm, a first p-type $(Al_{0.7}Ga_{0.3})_{0.5}In_{0.5}P$ cladding layer 3a having a thickness of 0.25 μm, a $Ga_{0.57}In_{0.43}P$ etching stopper layer 10 having a thickness of 5 nm, and a second p-type $(Al_{0.7}Ga_{0.3})_{0.5}In_{0.5}P$ cladding layer 3b having a thickness of 1.25 μm are successively formed on the n-type GaAs substrate 1. After the second p-type $(Al_{0.7}Ga_{0.3})_{0.5}In_{0.5}P$ cladding layer 3b is formed into a mesa shape by selective etching, using again the MOCVD apparatus, an n-type GaAs current blocking layer 4 is formed on a portion where the second p-type $(Al_{0.7}Ga_{0.3})_{0.5}In_{0.5}P$ cladding layer 3b is etched and removed. Further, a p-type GaAs cap layer 5 is formed on the top surfaces of the mesa shaped second p-type $(Al_{0.7}Ga_{0.3})_{0.5}In_{0.5}P$ cladding layer 3b and the n-type GaAs current blocking layer 4 to form a layer structure and an n-type and p-type electrode 13 and 14 are formed on the lowermost and uppermost surfaces, respectively, of this layer structure.

The production method of the above-described mesa shape second p-type $(Al_{0.7}Ga_{0.3})_{0.5}In_{0.5}P$ cladding layer 3b will be described with reference to FIGS. 2(a)–2(c).

Figure 1B:
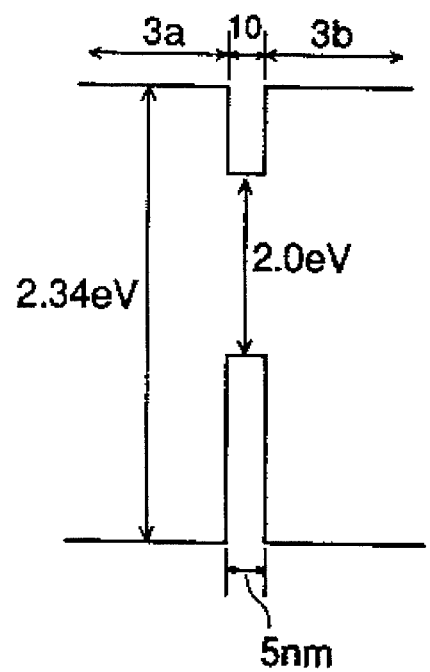
FIG. 1(b) is a diagram showing the energy band structure of an etching stopper layer.
Figure 2A:
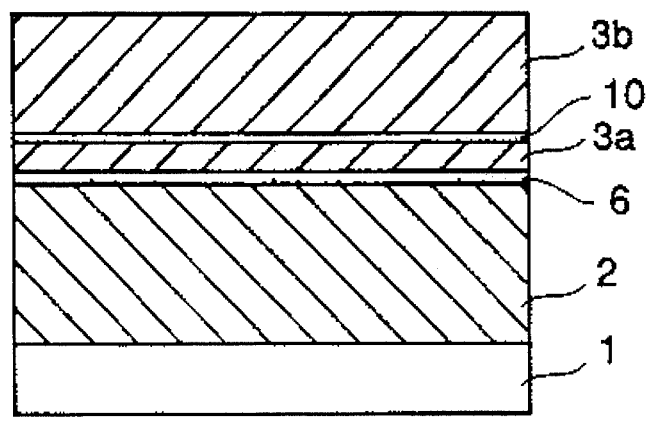
FIGS. 2(a)–2(c) are views for describing a method for manufacturing a visible light laser diode in accordance with the first embodiment of the present invention.

At first, as shown in FIG. 2(a), the $Ga_{0.57}In_{0.43}P$ etching stopper layer 10 having a thickness of 5 nm, and comprising $Ga_{0.57}In_{0.43}P$ which has an etching rate around one-fiftieth of the etching rate of $(Al_{0.7}Ga_{0.3})_{0.5}In_{0.5}P$ in a sulfuric acid series etching solution, is formed on the first p-type $(Al_{0.7}Ga_{0.3})_{0.5}In_{0.5}P$ cladding layer 3a, and the second p-type $(Al_{0.7}Ga_{0.3})_{0.5}In_{0.5}P$ cladding layer 3b is formed on the $Ga_{0.57}In_{0.43}P$ etching stopper layer 10. As shown in FIG. 1(b), the $Ga_{0.57}In_{0.43}P$ etching stopper layer 10 having a band gap energy in bulk of 2.00 eV forms a quantum well between the first and second $(Al_{0.7}Ga_{0.3})_{0.5}In_{0.5}P$ cladding layers 3a and 3b having a band gap energy in bulk of 2.34 eV.

Figure 2B:
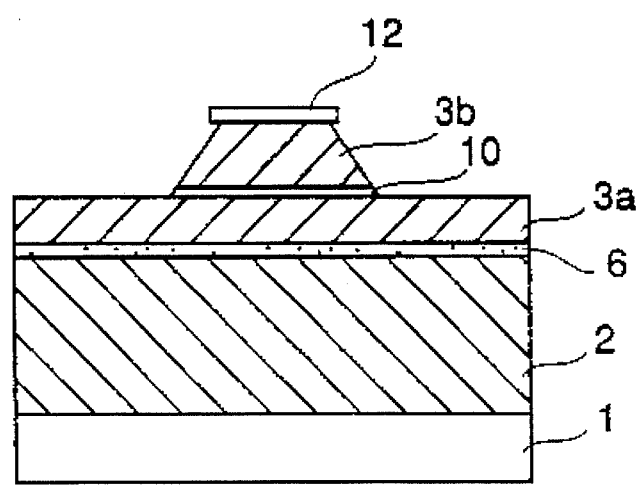

Then, as shown in FIG. 2(b), when using a SiN film 12 provided on the top surface of a part of the second p-type $(Al_{0.7}Ga_{0.3})_{0.5}In_{0.5}P$ cladding layer 3b and having a thickness of 3,000 to 5,000 angstroms as a mask, the second p-type $(Al_{0.7}Ga_{0.3})_{0.5}In_{0.5}P$ cladding layer 3b is etched by using the sulfuric acid series etching solution. Because the $Ga_{0.57}In_{0.43}P$ etching stopper layer 10 has an etching rate sufficiently lower than that of the second p-type $(Al_{0.7}Ga_{0.3})_{0.5}In_{0.5}P$ cladding layer 3b, it is possible to stop the etching with satisfactory controllability just before it reaches the first p-type $(Al_{0.7}Ga_{0.3})_{0.5}In_{0.5}P$ cladding layer 3a. Further, the mesa shape second p-type $(Al_{0.7}Ga_{0.3})_{0.5}In_{0.5}P$ cladding layer 3b can be formed with the first p-type $(Al_{0.7}Ga_{0.3})_{0.5}In_{0.5}P$ cladding layer 3a having a thickness of 0.25 μm remaining on the undoped $Ga_{0.5}In_{0.5}P$ active layer 6.

Figure 2C:
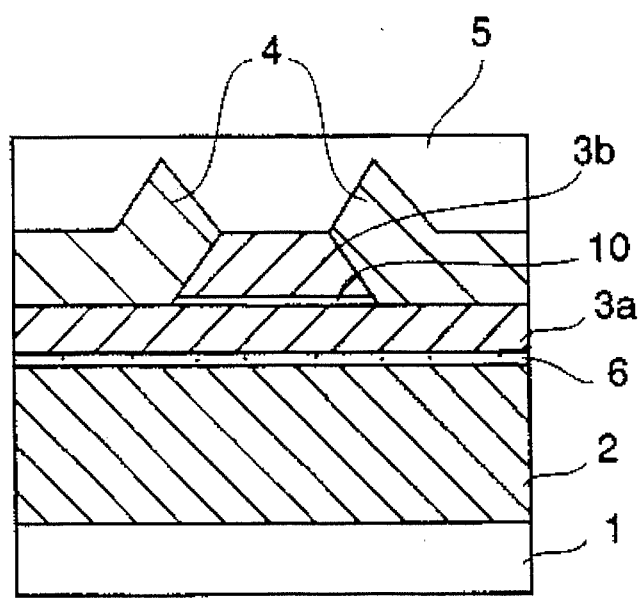

Then, as shown in FIG. 2(c), an n-type GaAs current blocking layer 4 is formed on a portion where the mesa shaped second p-type $(Al_{0.7}Ga_{0.3})_{0.5}In_{0.5}P$ cladding layer 3b is etched and removed. After removing the SiN film 12 which has been used as a mask while etching the cladding layer, a p-type GaAs cap layer 5 is formed on the exposed top portions of the mesa shaped second p-type $(Al_{0.7}Ga_{0.3})_{0.5}In_{0.5}P$ cladding layer 3b and the n-type GaAs current blocking layer 4, whereby a predetermined layer structure as shown in FIG. 1 is obtained.

A method for determining the thickness and composition of an etching stopper layer employing GaInP and a function of the $Ga_{0.57}In_{0.43}P$ etching stopper layer 10 determined by this method will be described in more detail, with reference to FIG. 6 to FIG. 11.

At first, a description is given of the thickness of an etching stopper layer. The second p-type $(Al_{0.7}Ga_{0.3})_{0.5}In_{0.5}P$ cladding layer 3b has a thickness of 1.25 μm, and the entire wafer thickness distribution amounts to ±10%. Therefore, the thickness distribution of entire wafer becomes:

$$1.25 \text{ μm} \times (0.1+0.1) = 0.25 \text{ μm} \tag{1}$$

It will be seen that it is necessary for the etching stopper layer to absorb the thickness distribution of 0.25 μm (250 nm).

Figure 6:
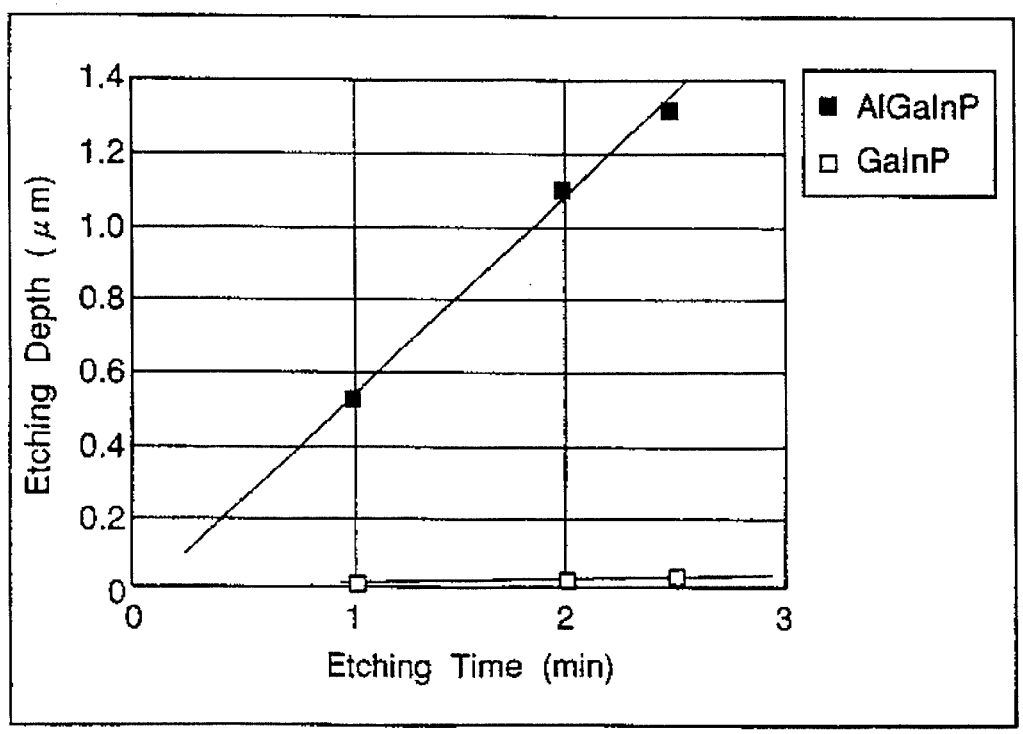
FIG. 6 is a graph illustrating the difference between the etching rates of AlGaInP and GaInP by a sulfuric acid series etching solution.

When an etching solution with the mixture ratio of sulfuric acid and water set to 1:1 and at 50° C. is used for etching, because the etching selectivity of the etching solution between AlGaInP and GaInP is about 58 as shown in FIG. 6, the etched depth becomes:

$$250 \text{ nm} \times 1/58 = 4.3 \text{ nm} \tag{2}$$

Therefore, from the equations (1) and (2), it will be seen that the etching stopper layer is required to have a thickness of at least 4.3 nm for perfectly stopping etching and, taking errors into considerations, the etching stopper layer can fulfill its function when it has a thickness of about 5 nm.

Figure 7A:
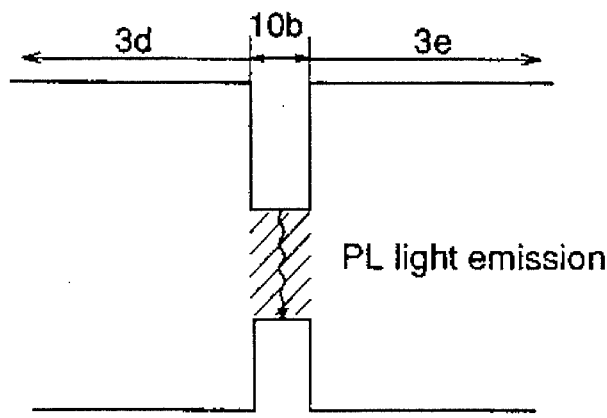
FIGS. 7(a) and 7(b) are diagrams illustrating the relation between the variation in the Ga composition of a $Ga_xIn_{1-x}P$ well layer formed between $(Al_{0.7}Ga_{0.3})_{0.5}In_{0.5}P$ barrier layers and the band gap energy thereof.
Figure 7B:
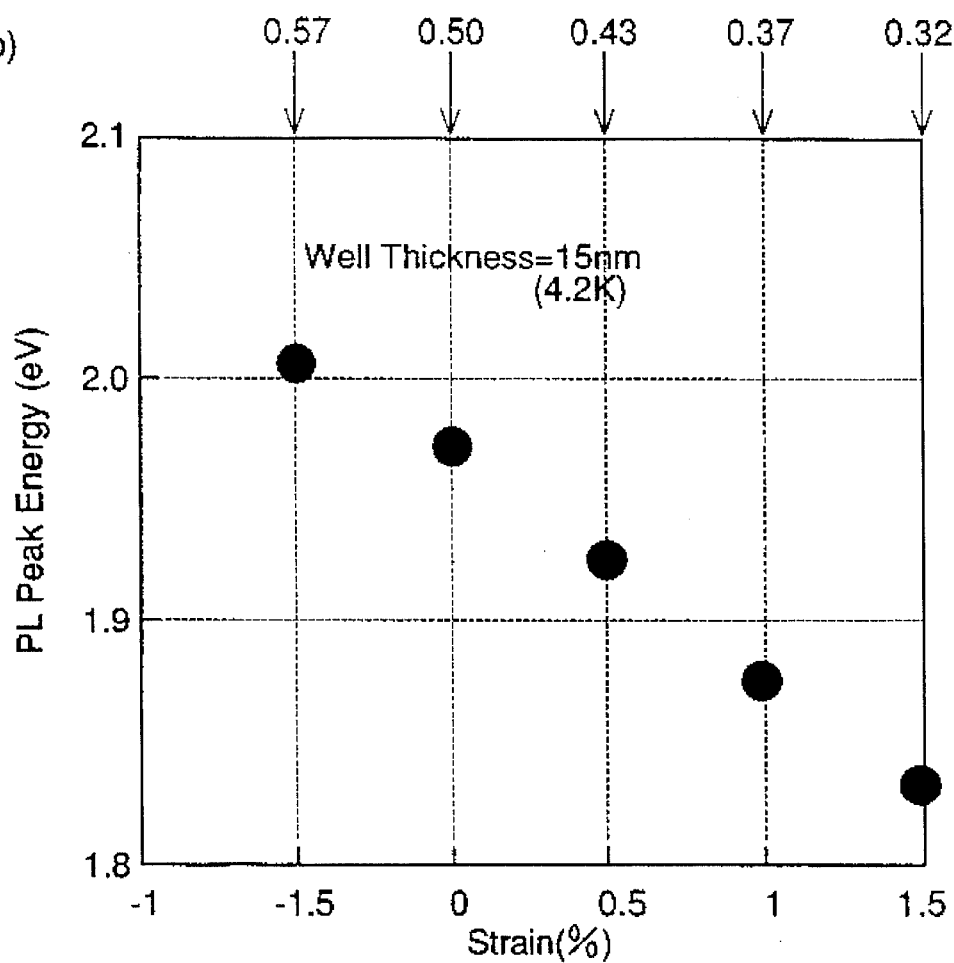

In order to determine the composition ratio of GaInP used for the etching stopper layer, as shown in FIG. 7(a), a $Ga_xIn_{1-x}P$ well layer 10b having a well width of 15 nm is formed by successively varying the Ga composition (x) between $(Al_{0.7}Ga_{0.3})_{0.5}In_{0.5}P$ barrier layers 3d and 3e above the GaAs substrate. On the basis of the wavelength of PL light emission measured with 4.2° K, the variation in the band gap energy of the $Ga_xIn_{1-x}P$ well layer 10b is examined and graphed as shown in FIG. 7(b). It will be seen that the band gap energy is increased with increased Ga composition (x), and the PL light emission wavelength becomes shorter. However, when the Ga composition (x) of the $Ga_xIn_{1-x}P$ well layer 10b is increased to greater than 0.5, the lattice constant becomes, of course, smaller than that of $Ga_{0.5}In_{0.5}P$, which is lattice matched with the GaAs substrate. Further, to the $Ga_xIn_{1-x}P$ well layer 10b applied is a stress in the pulling direction. Therefore, if the Ga proportion (x) is excessively increased, the critical stress is exceeded, resulting in the introduction of transpositions.

In order to confirm the presence of the above-described transpositions, a method such as TEM (transmission electron microscopy) has been employed heretofore. In such a method, however, a great deal of labor is required for the measurement. In addition, the measurement range is very narrow, and the reliability is low.

Figure 8A:
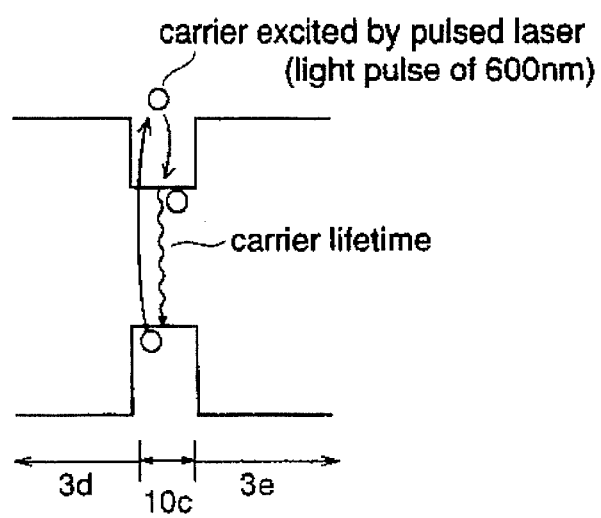
FIGS. 8(a) and 8(b) are diagrams illustrating the relation between the variation in respective well widths of unstrained $Ga_{0.5}In_{0.5}P$ and $Ga_{0.57}In_{0.43}P$ having a tensile strain of 0.5%.

In this first embodiment, there is used a method for measuring the critical thickness through quantum well carrier lifetime evaluation shown in the Proc. of Japan Society of Applied Physics, Autumn, 1992, 17P-ZE-9. As shown in FIG. 8(a), a $Ga_xIn_{1-x}P$ well layer 10c having several Ga compositions (x) is formed by successively varying the thickness thereof between $(Al_{0.7}Ga_{0.3})_{0.5}In_{0.5}P$ barrier layers 3d and 3e, and the carrier lifetime is evaluated in each case, thereby confirming the presence of transpositions.

Figure 8B:
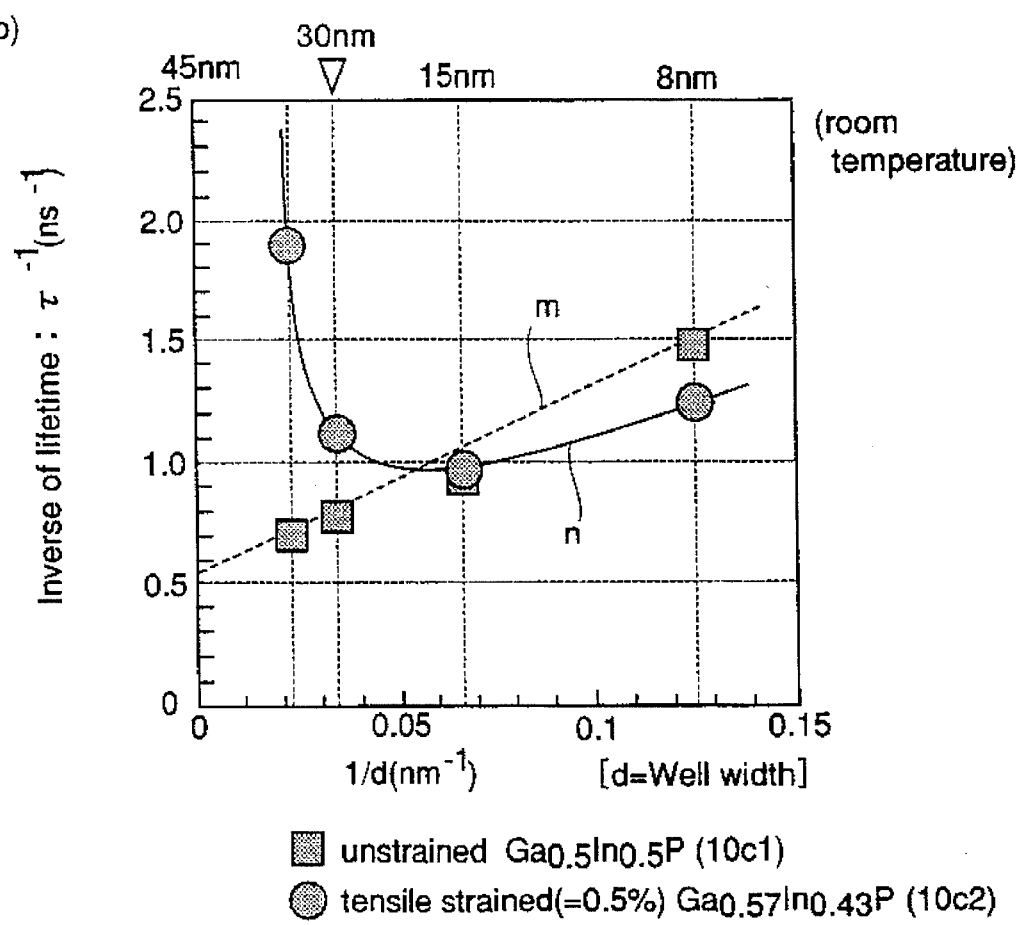

FIG. 8(b) shows the results of carrier lifetime evaluation for a $Ga_{0.5}In_{0.5}P$ well layer 10c1 which is strain-free, i.e., lattice matched to the GaAs substrate and has a Ga composition (x) of 0.5, and a $Ga_{0.57}In_{0.43}P$ well layer 10c2 having a Ga composition (x) of 0.57 corresponding to a tensile strain of 0.5% by respectively varying the layer thickness (well width d) thereof. From FIG. 8(b), with the strain-free $Ga_{0.5}In_{0.5}P$ well layer 10c1, the relation between the inverse (1/d) of the well width d and the inverse (1/τ) to the carrier lifetime is linear as shown by dashed plot m, and it will be seen that no transposition is introduced. On the other hand, with the $Ga_{0.57}In_{0.43}P$ well layer 10c2 having a tensile strain of 0.5%, the above-described relation is as shown by solid plot n. As the well width d is increased to exceed 15 nm, the carrier lifetime is rather deteriorated. As the well width d is further increased to exceed 30 nm, the carrier lifetime is steeply deteriorated. Thus, it will be seen that transpositions are introduced into the crystal. Conversely, this means that, with the $Ga_{0.57}In_{0.43}P$ well layer 10c2 in which the Ga composition (x) is set to 0.57 and 0.5% of tensile strain is introduced, the carrier lifetime τ is not deteriorated and no transposition is introduced when the thickness is 5 nm.

Figure 9A:
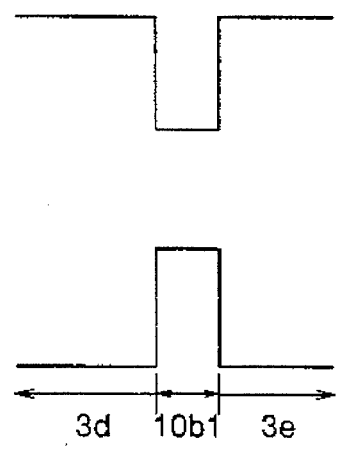
FIGS. 9(a) and 9(b) are diagrams illustrating the relationship among the Ga composition, lattice strain, and PL light emission wavelength of a $Ga_xIn_{1-x}P$ well layer having a thickness of 5 nm.

Further, as shown in FIG. 9(a), a $Ga_xIn_{1-x}P$ well layer 10b1 having a thickness of 5 nm, for which Ga compositions (x) are successively varied, is formed between $(Al_{0.7}Ga_{0.3})_{0.5}In_{0.5}P$ barrier layers 3d and 3e, and the PL light emission wavelength at room temperature is evaluated. As a result, the PL light emission wavelength is as shown by solid plot P in FIG. 9(b), and 0.5% of tensile strain is introduced. As described above, however, the PL light emission wavelength of the $Ga_xIn_{1-x}P$ well layer 10b1 having a Ga composition (x) of 0.57, which is free from transposition, is about 615 nm. This PL light emission wavelength is shorter by 5 to 10 nm than the intrinsic oscillation wavelength, and it is seen to be located on the shorter wavelength side of the PL light emission wavelength of the visible light laser diode with an oscillation wavelength of 633 nm.

As shown above, the $Ga_{0.57}In_{0.43}P$ etching stopper layer 10 is formed with a thickness of 5 nm between the first and second $(Al_{0.7}Ga_{0.3})_{0.5}In_{0.5}P$ cladding layers 3a and 3b and forms a quantum well having an energy quantum level exceeding the band gap energy of the undoped $Ga_{0.5}In_{0.5}P$ active layer 6, whereby it can perfectly stop the etching and absorb no light with a wavelength of 633 nm from the undoped $Ga_{0.5}In_{0.5}P$ active layer 6.

Figure 9B:
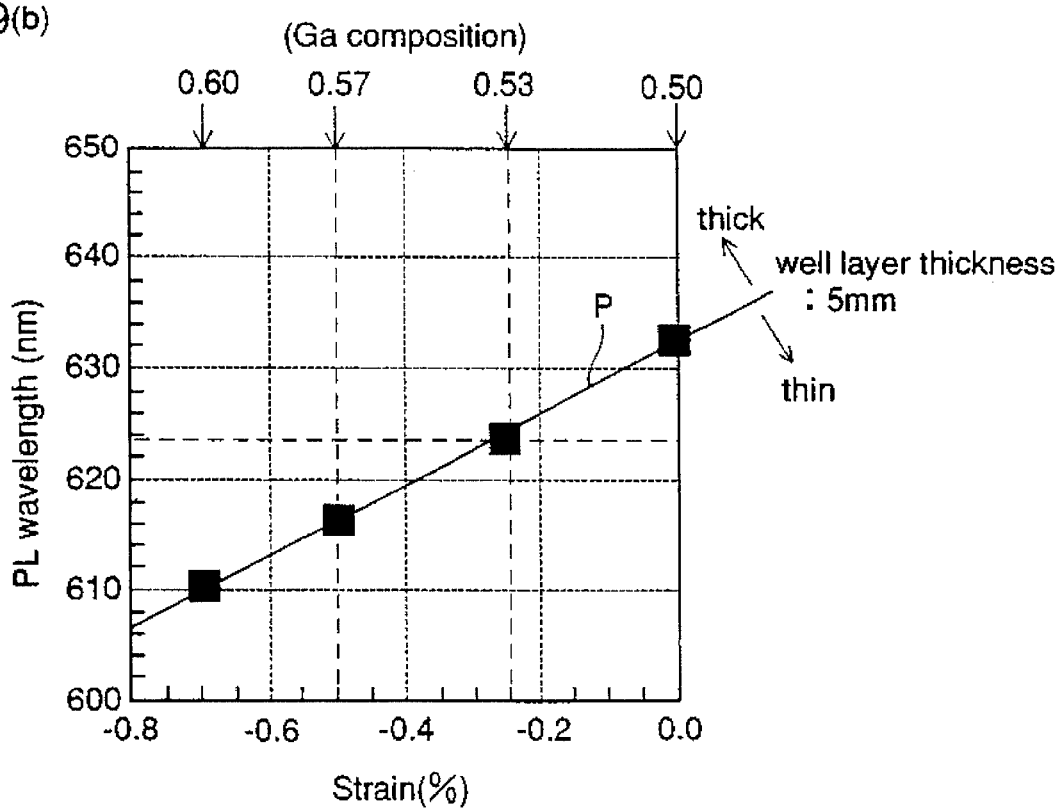
Figure 10:
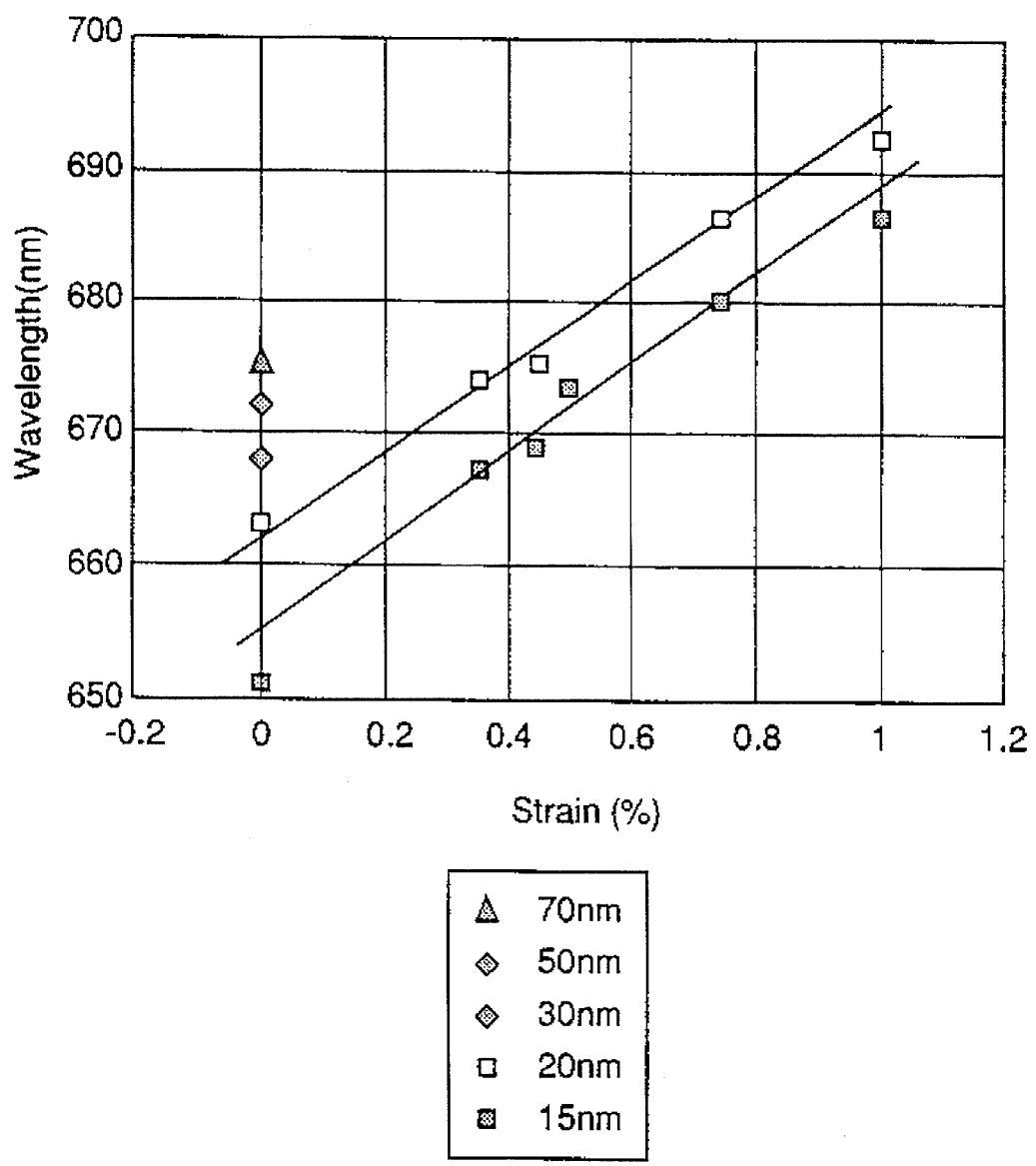
FIG. 10 is a diagram illustrating the relationship among well width, lattice strain, and oscillation wavelength of a GaInP well layer.
Figure 11:
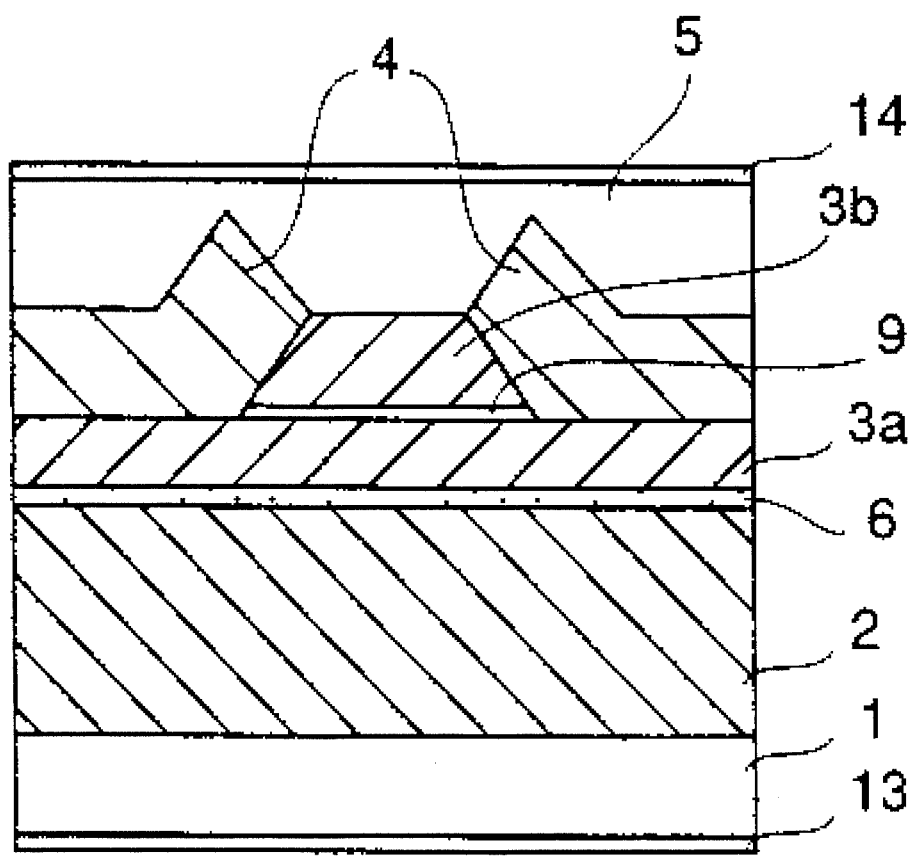
FIG. 11 is a sectional view illustrating a prior art visible light laser diode.
Figure 12A:
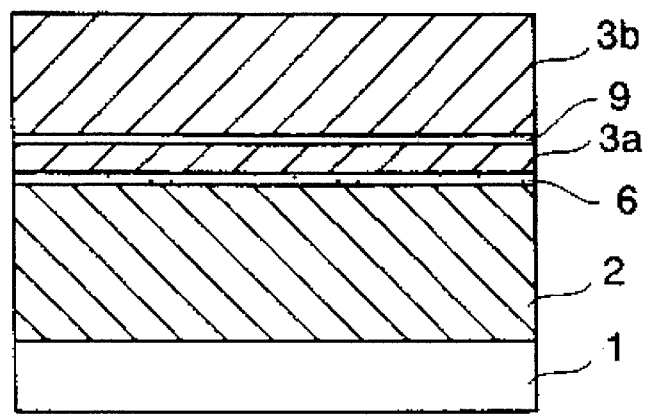
FIGS. 12(a)–12(c) are views for explaining a prior art method for manufacturing a visible light laser diode.
Figure 12B:
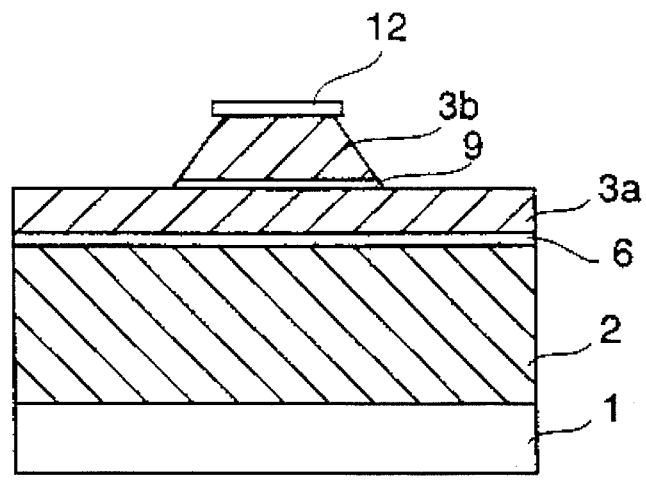
Figure 12C:
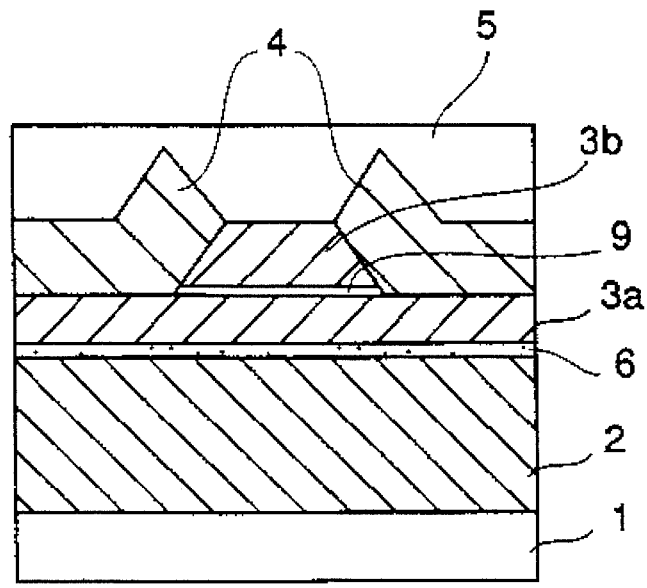
Figure 13A:
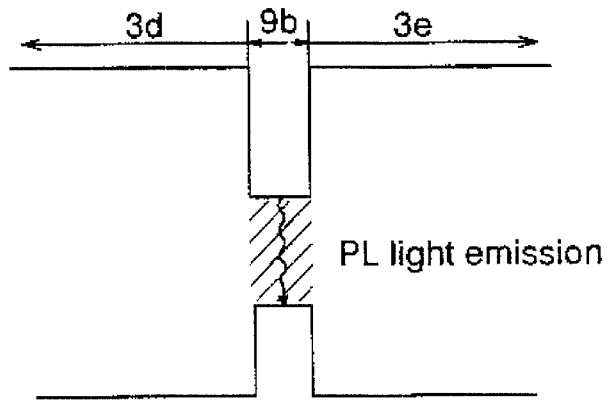
FIGS. 13(a) and 13(b) are diagrams illustrating the relation between variation in the well width of a $Ga_{0.5}In_{0.5}P$ well layer formed between $(Al_{0.7}Ga_{0.3})_{0.5}In_{0.5}P$ barrier layers and the band gap energy thereof (which is obtained from the PL light wavelength of the well layer).
Figure 13B:
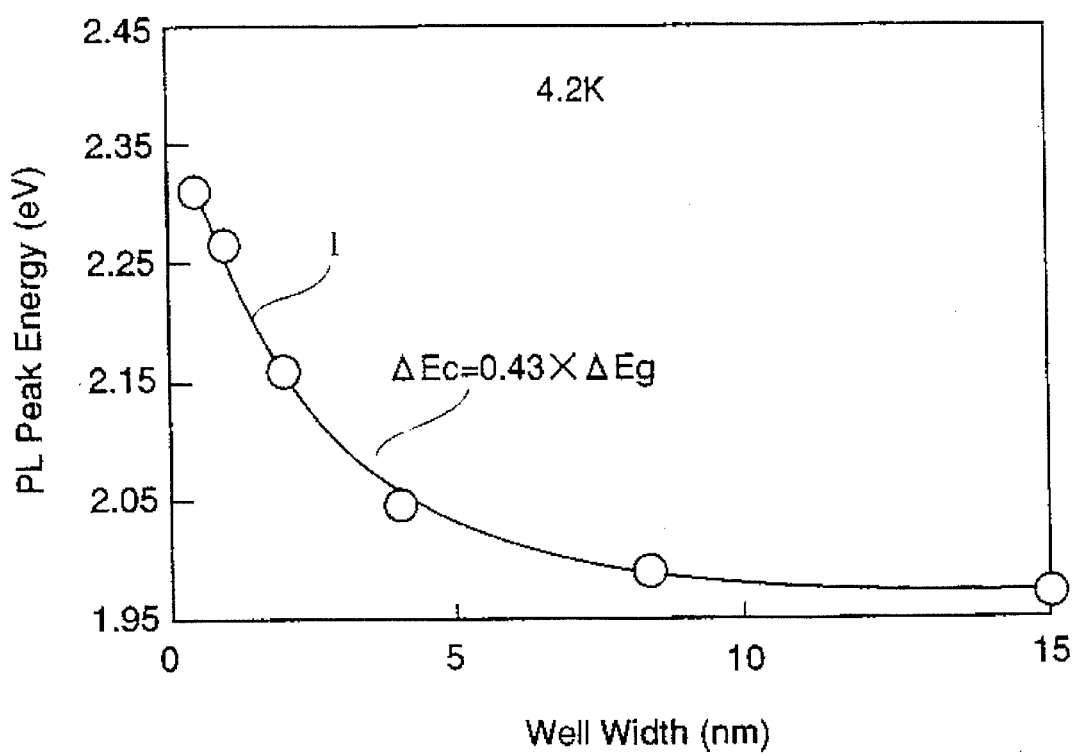

As is seen from FIG. 9(b), so long as the thickness of the GaInP etching stopper layer 10 is 5 nm, even when setting the Ga composition to 0.53, the PL light wavelength is about 623 nm, and the etching stopper layer does not absorb light with a wavelength of 633 nm. Further, when using an etching solution providing for a higher etching selectivity and etching the second $(Al_{0.7}Ga_{0.3})_{0.5}In_{0.5}P$ cladding layer 3b, it is possible to set the thickness of the GaInP etching stopper layer 10 to be less than 5 nm. As is seen from FIG. 10, showing the result of examination of the relationship among the quantum well width, lattice strain, and oscillation wavelength. By forming the $Ga_{0.5}In_{0.5}P$ well layer between two $(Al_{0.7}Ga_{0.3})_{0.5}In_{0.5}P$ barrier layers, the quantum well, which is formed by the GaInP etching stopper layer 10 having a reduced thickness, has a further increased energy quantum level, and it is possible to cope with a visible light laser diode oscillation wavelength of less than 633 nm.

Japanese Published Patent Application No. Hei 4-25192 shows, in a semiconductor laser element and a manufacturing method thereof, a laminated structure obtained by successively forming a GaInP active layer lattice matched to a GaAs substrate, an AlGaInP cladding layer, a GaInP etching stopper layer, and a GaAs light absorption layer on a GaAs substrate. The band gap energy of the GaInP etching stopper layer is set to be greater than that of the GaInP active layer. The GaInP etching stopper layer of this publication, however, increases the band gap energy through thickness control, and unlike $Ga_{0.57}In_{0.43}P$ etching stopper layer 10 provided in the visible light laser diode of this first embodiment, does not increase the band gap energy by increasing the Ga composition. In addition, as described employing the equations (1) and (2), there is determined a lower limit on the thickness of the etching stopper layer that is introduced in the AlGaInP cladding layer. That is, if the thickness of the etching stopper layer is set to be less than the lower limit in order to increase the band gap energy, etching controllability is lost.

In the manufacturing method of a visible light laser diode according to this first embodiment, the $Ga_{0.57}In_{0.43}P$ etching stopper layer 10 employing a thin crystalline film having a band gap energy in bulk of 2.00 eV and having a thickness of 5 nm, is formed between the first and second $(Al_{0.7}Ga_{0.3})_{0.5}In_{0.5}P$ cladding layers 3a and 3b using a thin crystalline film having a band gap energy in bulk of 2.34 eV, and the second $(Al_{0.7}Ga_{0.3})_{0.5}In_{0.5}P$ cladding layer 3b is etched to a predetermined shape using a sulfuric acid series etching solution. Therefore, the etching can be stopped just before reaching the first $(Al_{0.7}Ga_{0.3})_{0.5}In_{0.5}P$ cladding layer 3a to form the second $(Al_{0.7}Ga_{0.3})_{0.5}In_{0.5}P$ cladding layer 3b into a predetermined shape. Although the visible light laser diode manufactured by the method including this etching process may have a laminated structure in which the $Ga_{0.57}In_{0.43}P$ etching stopper layer 10 partly remains on the $Ga_{0.5}In_{0.5}P$ active layer 6, the $Ga_{0.57}In_{0.43}P$ etching stopper layer 10 does not absorb light with an oscillation wavelength of 633 nm from the $Ga_{0.5}In_{0.5}P$ active layer 6, and it is possible to obtain a visible light laser diode which has a low laser oscillation threshold value and a satisfactory current characteristic at a high power output.

While this first embodiment describes a visible light laser diode having the above-described laminated structure and with the oscillation wavelength of 633 nm, it is not limited to this embodiment, and the above-described effects are of course obtainable with laser diodes other than the above-described visible light laser diode as well by determining the material and thickness of the etching stopper layer corresponding to the laser diode by the method as described in detail using FIGS. 6 to 11.

Embodiment 2

Figure 3A:
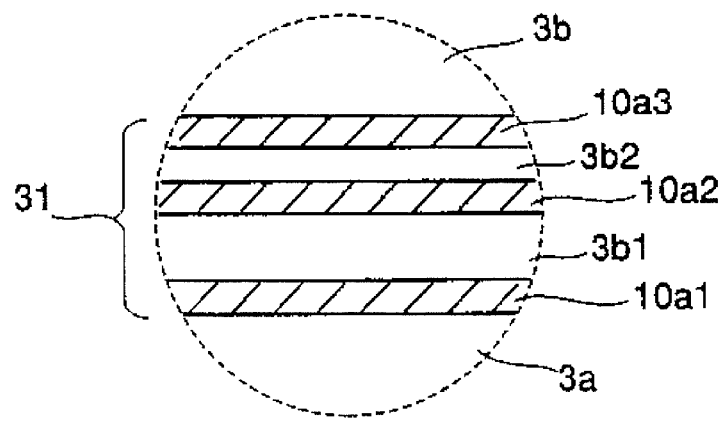
FIGS. 3(a) and 3(b) are sectional views illustrating a laminated structure before the etching process in a method for manufacturing a visible light laser diode in accordance with a second embodiment of the present invention.
Figure 3B:
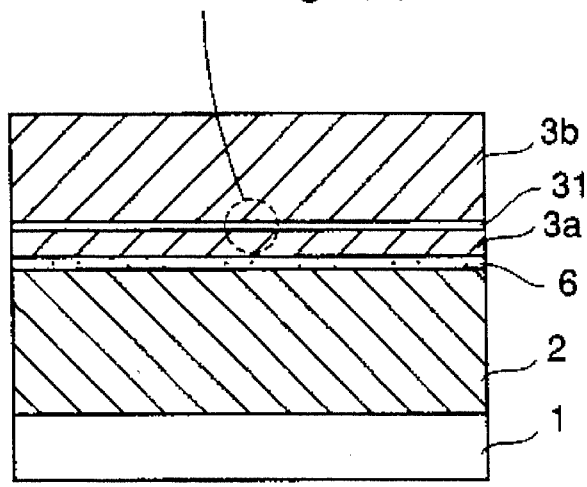

A visible light laser diode and a manufacturing method thereof according to a second embodiment of the present invention are the same as those in the above-described first embodiment except for an etching stopper layer. Using an MOCVD apparatus, a plurality of semiconductor layers are successively formed on a GaAs substrate 1. FIG. 3(a) is an enlarged sectional view illustrating the laminated structure of an etching stopper layer provided for a visible light laser diode according to this second embodiment. FIG. 3(b) is a sectional view illustrating the laminated structure of a cladding layer formed above an active layer before the etching process,.and this corresponds to FIG. 2(a) of the above-described first embodiment. In the figures, the same reference numerals designate the same or corresponding portions as those shown in FIG. 2 of embodiment 1. Reference numeral 31 designates an etching stopper layer, which includes a p-type $(Al_{0.7}Ga_{0.3})_{0.5}In_{0.5}P$ barrier layer $3b1$ having a thickness of 2 nm, a p-type $(Al_{0.7}Ga_{0.3})_{0.5}In_{0.5}P$ barrier layer $3b2$ having a thickness of 1 nm, and three p-type $Ga_{0.57}In_{0.43}P$ well layers $10a1$ to $10a3$ each having a thickness of 1.7 nm.

As shown in FIG. 3(a), the etching stopper layer 31 is formed by successively forming the p-type $Ga_{0.57}In_{0.43}P$ well layer $10a1$, the p-type $(Al_{0.7}Ga_{0.3})_{0.5}In_{0.5}P$ barrier layer $3b1$, the p-type $Ga_{0.57}In_{0.43}P$ well layer $10a2$, the p-type $(Al_{0.7}Ga_{0.3})_{0.5}In_{0.5}P$ barrier layer $3b2$, and the p-type $Ga_{0.57}In_{0.43}P$ well layer $10a3$ on a first p-type $(Al_{0.7}Ga_{0.3})_{0.5}In_{0.5}P$ cladding layer $3a$. Subsequently, the second p-type $(Al_{0.7}Ga_{0.3})_{0.5}In_{0.5}P$ cladding layer $3b$ is formed on the p-type $Ga_{0.57}In_{0.43}P$ well layer $10a3$.

That is, the etching stopper layer 31 in this second embodiment comprises the three p-type $Ga_{0.57}In_{0.43}P$ well layers $10a1$ to $10a3$, which correspond to three equally divided portions of the $Ga_{0.57}In_{0.43}P$ etching stopper layer 10 having a thickness of 5 nm in the first embodiment, form a multiple quantum well with the first and second p-type $(Al_{0.7}Ga_{0.3})_{0.5}In_{0.5}P$ cladding layers $3a$ and $3b$ and p-type $(Al_{0.7}Ga_{0.3})_{0.5}In_{0.5}P$ barrier layers $3b$ and $3b2$ as quantum barriers. Thus, when etching the second p-type $(Al_{0.7}Ga_{0.3})_{0.5}In_{0.5}P$ cladding layer $3b$ into the mesa form using the sulfuric acid series etching solution, the etching is stopped at either one of the three-p-type $Ga_{0.57}In_{0.43}P$ well layers $10a1$ to $10a3$. Subsequently, the visible light laser diode may be completed such that it has a laminated structure with the etching stopper layer 31 partly remaining on the undoped $Ga_{0.5}In_{0.5}P$ active layer 6. Again in this case, owing to the multiple quantum well effect, the etching stopper layer 31 has a larger band gap energy than that of the etching stopper layer 10 in the first embodiment.

According to this second embodiment, since there is provided the etching stopper layer 31 having the multiple quantum well structure comprising the p-type $(Al_{0.7}Ga_{0.3})_{0.5}In_{0.5}P$ barrier layers $3b$ and $3b2$ and p-type $Ga_{0.57}In_{0.43}P$ well layers $10a1$ to $10a3$, the second p-type $(Al_{0.7}Ga_{0.3})_{0.5}In_{0.5}P$ cladding layer $3b$ on the layer 31 can be etched into a predetermined shape with high controllability. Therefore, in the laser operation, light with the oscillation wavelength of 633 nm from the undoped $Ga_{0.5}In_{0.5}P$ active layer 6 is not absorbed by the upper etching stopper layer 31, and it is possible to obtain a visible light laser diode with a satisfactory current characteristic at high output oscillation.

Embodiment 3

Figure 4A:
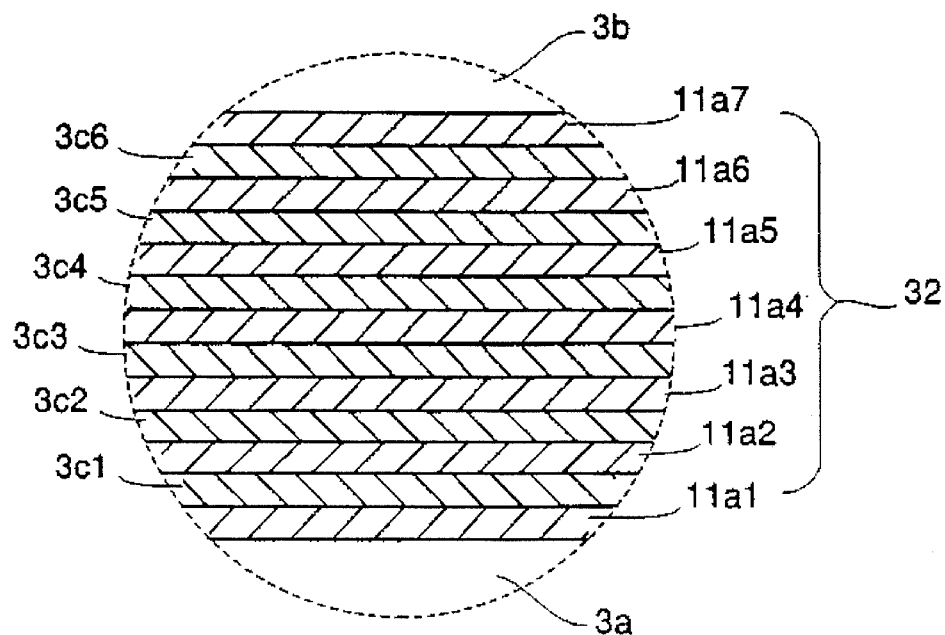
FIGS. 4(a) and 4(b) are sectional views illustrating a laminated structure before the etching process in a method for manufacturing a visible light laser diode in accordance with a third embodiment of the present invention.
Figure 4B:
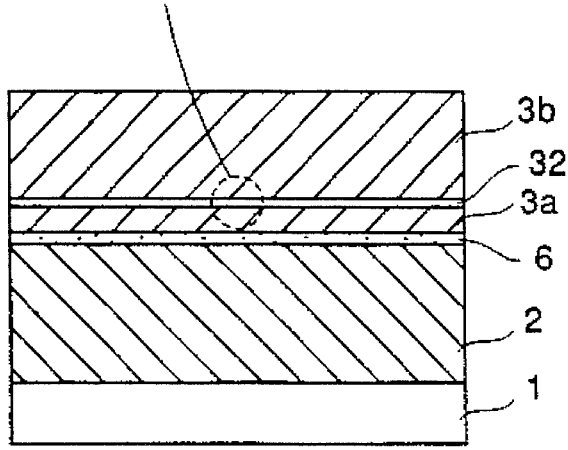

A visible light laser diode and a manufacturing method thereof according to a third embodiment of the present invention are the same as in the first embodiment except for the structure and production method of an etching stopper layer. FIG. 4(a) is a partially enlarged sectional view illustrating an etching stopper layer in the visible light laser diode in this third embodiment. FIG. 4(b) is a view illustrating the laminated structure of a cladding layer formed above an active layer before the etching process, and corresponding to FIG. 2(a) of the first embodiment. In the figures, the same reference numerals designate the same or corresponding portions as those shown in FIGS. 2(a)–2(c) of the first embodiment. Reference numeral 32 designates an etching stopper layer, which has a multiple quantum well structure obtained by alternately laminating p-type $Ga_{0.57}In_{0.43}P$ layers $11a1$ to $11a7$ having a total thickness of 10 nm and p-type $(Al_yGa_{1-y})_{0.43}In_{0.57}P$ layers ($y \geq 0.7$) $3c1$ to $3c6$.

As shown in FIG. 4(a), the etching stopper layer 32 is formed on the first p-type $(Al_{0.7}Ga_{0.3})_{0.5}In_{0.5}P$ cladding layer $3a$ such that it has a zero net strain structure, in which a stress in the tensile direction (corresponding to a tensile strain of 0.5%) applied to the p-type $Ga_{0.57}In_{0.43}P$ layers $11a1$ to $11a7$ acting as a quantum well is canceled by an equal quantity of a stress in the compressive direction (corresponding to a compressive strain of 0.5%) applied to the p-type $(Al_yGa_{1-y})_{0.43}In_{0.57}P$ layers $3c1$ to $3c6$. Therefore, no transposition is introduced even when the critical thickness is exceeded by the sum of thicknesses of the p-type $Ga_{0.57}In_{0.43}P$ layers $11a1$ to $11a7$. Further, etching controllability better than those of the first and second embodiments can be obtained in the process of etching the second p-type $(Al_{0.7}Ga_{0.3})_{0.5}In_{0.5}P$ cladding layer $3b$, and it is possible to obtain the increased band gap energy after forming.

According to this third embodiment, since the etching stopper layer 32 having a zero net strain structure and also a multiple quantum well structure is formed, it is possible to increase the thickness or number of the p-type $Ga_{0.57}In_{0.43}P$ layers $11a1$ to $11a7$ to enhance etching controllability without generating any transposition. Further, by increasing the multiplicity of the quantum well comprising $Ga_{0.57}In_{0.43}P$, it is possible to further increase the band gap energy so as to prevent absorption of the light emitted from the undoped $Ga_{0.5}In_{0.5}P$ active layer 6.

While the tensile or compressive strain in each layer of the etching stopper layer 32 has been set to 0.5%, this is by no means limiting. If the etching stopper layer comprises a zero net strain structure, and has a larger band gap energy than that of the undoped $Ga_{0.5}In_{0.5}P$ active layer 6, it is of course possible to change the compositions of the p-type GaInP and AlGaInP layers constituting the etching stopper layer into the predetermined compositions, thereby changing the strain amount.

Embodiment 4

Figure 5:
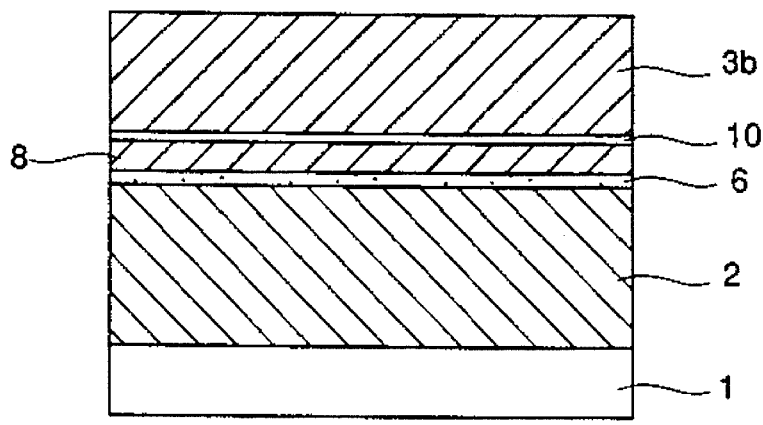
FIG. 5 is a sectional view illustrating a laminated structure before the etching-process in a method for manufacturing a visible light laser diode in accordance with a fourth embodiment of the present invention.

FIG. 5 is a view illustrating the laminated structure of a cladding layer in a visible light laser diode according to a fourth embodiment of the present invention and corresponding to FIG. 2(a) of the first embodiment. In the figure, the same reference numerals designate-the same or corresponding portions as those shown in FIG. 2 of the first embodiment. Reference numeral 8 designates a stress adjustment layer, which is formed with such a thickness that the stress due to the lattice strain in a $Ga_{0.57}In_{0.43}P$ etching stopper layer 10 that is formed above can be given to a undoped $Ga_{0.5}In_{0.5}P$ active layer 6 that is formed below that.

In the above-described first embodiment, the first p-type $(Al_{0.7}Ga_{0.3})_{0.5}In_{0.5}P$ cladding layer 3a having a thickness of 250 nm is formed on the undoped $Ga_{0.5}In_{0.5}P$ active layer 6. In this fourth embodiment, however, the first p-type $(Al_{0.7}Ga_{0.3})_{0.5}In_{0.5}P$ cladding layer 3a having a thickness of 249 nm is formed and is made a stress adjusting layer 8. Therefore, the $Ga_{0.57}In_{0.43}P$ etching stopper layer 10, which is formed on the stress adjusting layer 8 and has a lattice constant smaller than that of the GaAs substrate 1, can be used as a stresser to provide a stress in the compressive direction on the undoped $Ga_{0.5}In_{0.5}P$ active layer 6, thereby increasing the band gap energy of the undoped $Ga_{0.5}In_{0.5}P$ active layer 6 and decreasing the oscillation wavelength below 633 nm.

According to this fourth embodiment, it is possible to obtain, in addition to the effects in the above-described embodiment 1, an effect of making the oscillation wavelength of the visible light laser diode shorter.

In order to use the etching stopper layer as a stress applying means for making the oscillation wavelength shorter, it has a tensile strain, and it is of course possible to use the etching stopper layer 31 in the above-described second embodiment.

What is claimed is:

1. A visible light laser diode comprising:

an active layer having a band gap energy;

a cladding layer disposed on said active layer; and an etching stopping layer for forming said cladding layer, having a shape, and located at a position within said cladding layer, said etching stopping layer comprising at least one crystalline film of $Ga_xIn_{1-x}P$ ($0.53 \leq x \leq 0.57$) having a lower etching rate in an etching solution than said cladding layer, having a larger band gap energy in bulk than the band gap energy of said active layer, and that produces a quantum well structure within the cladding layer having a quantum energy level exceeding an energy corresponding to the wavelength of light produced by the visible light laser diode.

2. The visible light laser diode according to claim 1 wherein said etching stopping layer has an etching rate less than one-fiftieth of that of said cladding layer in a sulfuric acid series etching solution.

3. The visible light laser diode according to claim 2 comprising:

a GaAs substrate having a lattice constant; and a plurality of semiconductor layers grown on said GaAs substrate wherein said active layer is a multiple quantum well structure employing GaInP, said cladding layer is crystalline AlGaInP, and said etching stopping layer has a lattice constant smaller than the lattice constant of said GaAs substrate.

4. The visible light laser diode according to claim 3 wherein said visible light laser diode produces 633 nm band visible light, said active layer comprises $Ga_{0.5}In_{0.5}P$, said cladding layer has a band gap energy in bulk of 2.34 eV, and said etching stopping layer has a band gap energy in bulk of 2.00 eV and forms a single quantum well.

5. The visible light laser diode according to claim 4 wherein the single quantum well has a width of about 5 nm.

6. The visible light laser diode according to claim 3 wherein said visible light laser diode produces 633 nm band visible light and said active layer comprises $Ga_{0.5}In_{0.5}P$, said cladding layer comprises $(Al_{0.7}Ga_{0.3})_{0.5}In_{0.5}P$, and said etching stopping layer comprises a multiple quantum well structure including alternating crystalline films of $Ga_xIn_{1-x}P$ ($0.53 \leq x \leq 0.57$) having respective thicknesses and $(Al_{0.7}Ga_{0.3})_{0.5}In_{0.5}P$.

7. The visible light laser diode according to claim 6 wherein the sum of thicknesses of said $Ga_xIn_{1-x}P$ crystalline films is about 5 nm.

8. The visible light laser diode according to claim 3 wherein said etching stopping layer is disposed at a position at which stress from a lattice mismatch between said etching stopping layer and said GaAs substrate is transferred to said active layer.

9. The visible light laser diode according to claim 3 wherein said visible light laser diode produces 633 nm band visible light, said active layer comprises $Ga_{0.5}In_{0.5}P$, and said etching stopping layer has a multiple quantum well structure including alternating crystalline films of $Ga_xIn_{1-x}P$ ($0.53 \leq x \leq 0.57$) having respective thicknesses and $(Al_yGa_{1-y})_{1-x}In_xP$ ($0.7 \leq y \leq 1$, $0.53 \leq x \leq 0.57$).

10. The visible light laser diode according to claim 9 wherein the sum of the thicknesses of said $Ga_xIn_{1-x}P$ crystalline layers is about 5 nm.

11. A method for manufacturing a visible light laser diode including processing a cladding layer formed on an active layer into a shape comprising:

employing a material having a lower etching rate in an etching solution than a material forming a cladding layer and having a larger band gap energy in bulk than the band gap energy of said active layer as an etching stopping layer, forming an etching stopping layer including at least one crystalline film of $Ga_xIn_{1-x}P$ ($0.53 \leq x \leq 0.57$) within said cladding layer and has a thickness that forms a quantum well structure with said cladding layer that has a quantum energy level exceeding an energy corresponding to the oscillation wavelength of the visible light laser diode.

12. The method for manufacturing a visible light laser diode according to claim 11 comprising:

forming said active layer to have a multiple quantum well structure and including GaInP on a GaAs substrate;

forming a first part of said cladding layer employing AlGaInP on said active layer;

forming on the first part of said first cladding layer said etching stopping layer having a smaller lattice constant than the lattice constant of said GaAs substrate;

forming a second part Of said cladding layer employing AlGaInP on said etching stopping layer; and etching and removing part of the second part of said cladding layer.

13. The method for manufacturing a visible light laser diode according to claim 12 wherein the second part of said cladding layer is etched with a sulfuric acid etching solution and the ratio of the etching rates of said cladding layer and of said etching stopping layer is about 50:1.

14. The method for manufacturing a visible light laser diode according to claim 13 wherein said visible light laser diode produces 633 nm band visible light, said active layer comprises $Ga_{0.5}In_{0.5}P$, said cladding layer comprises AlGaInP having a band gap energy in bulk of 2.34 eV, and said etching stopping layer has a band gap energy in bulk of 2.00 eV.

15. The method for manufacturing a visible light laser diode according to claim 13 wherein said visible light laser diode produces 633 nm band visible light, said active layer is $Ga_{0.5}In_{0.5}P$, said cladding layer comprises $(Al_{0.7}Ga_{0.3})_{0.5}In_{0.5}P$, and said etching stopping layer comprises alternating crystalline films of $Ga_xIn_{1-x}P$ ($0.53 \leq x \leq 0.57$) having respective thicknesses and $(Al_{0.7}Ga_{0.3})_{0.5}In_{0.5}P$.

16. The method for manufacturing a visible light laser diode according to claim 15 wherein the sum of thicknesses of said $Ga_xIn_{1-x}P$ crystalline films is about 5 nm.

17. The method for manufacturing a visible light laser diode according to claim 13 comprising forming the first part of said cladding layer in a thickness so that a stress from lattice mismatching between said etching stopping layer and said GaAs substrate is applied to said active layer.

18. The method for manufacturing a visible light laser diode according to claim 13 wherein said visible light laser diode produces 633 nm band visible light, said active layer comprises $Ga_{0.5}In_{0.5}P$, said cladding layer comprises $(Al_{0.7}Ga_{0.3})_{0.5}In_{0.5}P$, and said etching stopping layer comprises alternating crystalline films of $Ga_xIn_{1-x}P$ ($0.53 \leq x \leq 0.57$) having respective thicknesses and $(Al_yGa_{1-y})_{1-x}In_xP$ ($0.7 \leq y \leq 1$, $0.53 \leq x \leq 0.57$), including etching and partially removing part of the second part of said $(Al_{0.7}Ga_{0.3})_{0.5}In_{0.5}P$ cladding layer.

19. The method for manufacturing a visible light laser diode according to claim 18 wherein the sum of thicknesses of said $Ga_xIn_{1-x}P$ crystalline films is about 5 nm.

\* \* \* \* \*